United States Patent [19]

Matloubian et al.

[11] Patent Number: 4,974,051
[45] Date of Patent: Nov. 27, 1990

[54] MOS TRANSISTOR WITH IMPROVED RADIATION HARDNESS

[75] Inventors: Mishel Matloubian, Dallas; Cheng-Eng D. Chen, Richardson; Terence G. Blake, Dallas, all of Tex.

[73] Assignee: Texas Instruments Incorporated, Dallas, Tex.

[21] Appl. No.: 150,799

[22] Filed: Feb. 1, 1988

[51] Int. Cl.⁵ .............................................. H01L 29/78
[52] U.S. Cl. .................................... 357/52; 357/23.11; 357/23.7
[58] Field of Search ...................... 357/52, 23.11, 23.7, 357/67 S

[56] References Cited

U.S. PATENT DOCUMENTS 4,053,916  10/1977  Cricchi et al. ........................ 357/23
4,591,890   5/1986  Lund et al. ....................... 357/23.11
4,753,896   6/1988  Matlousian ........................... 437/29

OTHER PUBLICATIONS

Lee et al., "Island Edge Effects in CMOS/SOS Transistors," *IEEE Trans. E.D.*, vol. ED-25, No. 8 (Aug. 1978), pp. 971–978.
Tihanyi et al., "Properties of ESFI MOS Transistors Due to the Floating Substrate and the Finite Volume," *IEEE TRans. E.D.*, vol. ED-22, No. 11 (Nov. 1975), pp. 1017–1023.
Tihanyi et al., "Influence of the Floating Substrate Potential on the Characteristics of ESFI MOS Transistors," *Solid State Electronics*, vol. 18 (Pergamon, 1975), pp. 309–314.

*Primary Examiner*—Andrew J. James
*Assistant Examiner*—Mark Prenty
*Attorney, Agent, or Firm*—Rodney M. Anderson; Melvin Sharp

[57] ABSTRACT

An MOS transistor is disclosed which has a guard ring for prevention of source-to-drain conduction through the isolation oxide after exposure to ionizing radiation. In the described example of an n-channel transistor, a p+ region is formed at the edges of the source region in a self-aligned fashion relative to the gate electrode so as not to extend under the gate to contact the drain region. This p+ region forms a diode which retards source-drain conduction even if a channel is formed under the isolating field oxide where the gate electrode overlaps onto the field oxide. The structure may be silicided for improved series resistance. An example of the transistor formed in an SOI configuration is also disclosed.

11 Claims, 5 Drawing Sheets

MOS TRANSISTOR WITH IMPROVED RADIATION HARDNESS

This invention was made with Government support under contract No. DNA 001-86-C 0090 awarded by the Defense Nuclear Agency. The Government has certain rights in this invention.

This invention is in the field of integrated circuits, and is specifically directed to insulated-gate field effect transistors.

BACKGROUND OF THE INVENTION

The electrical characteristics of metal-oxide-semiconductor (MOS) transistors are known to be affected by exposure to ionizing radiation of sufficient dose and energy. One of the effects of such radiation is the shift of the threshold voltage of the MOS transistor due to charge trapping in dielectric layers, and to the generation of surface states at the semiconductor-dielectric interface. These effects of ionizing radiation occur not only at the relatively thin gate dielectric of the MOS transistor, but also at the thicker dielectric layers used to isolate transistors from one another. The shift of the flatband voltage of an MOS capacitor from a given level of ionizing radiation is known to depend strongly on the thickness of the dielectric layer (i.e., is proportional to the second or third power of the dielectric thickness). Accordingly, a transistor with a thicker dielectric will have its threshold voltage affected to a greater extent than a similarly sized transistor with a thinner dielectric.

A parasitic MOS transistor is formed at locations of an integrated circuit where the gate electrode (or any conductor) overlaps the isolation dielectric. For example, a parasitic sidewall transistor is formed in parallel to a thin gate MOS transistor as the gate electrode leaves the moat region and extends onto the isolation dielectric layer. The strong dependency of the threshold voltage shift due to radiation on dielectric thickness can cause the threshold voltage of the parasitic transistor to shift to a greater degree than that of the operating transistor, increasing the likelihood of source-to-drain conduction through a channel under the isolation dielectric rather than through the operating transistor. For a sufficiently high radiation dose, the threshold voltage of the parasitic transistor can fall below the threshold voltage of the operating transistor, causing source-to-drain leakage for a transistor which would otherwise be in the off state.

It is therefore an object of this invention to provide an insulated-gate field effect transistor having an isolation scheme with improved tolerance to threshold voltage shifts from ionizing radiation.

It is another object of this invention to provide such a transistor which can be fabricated with a minimum of additional masking steps.

It is another object of this invention to provide such a transistor which can be fabricated in conjunction with silicide-cladding of the source and drain diffusions.

Other objects and advantages of the invention will become apparent to those of ordinary skill in the art having reference to this specification and the accompanying drawings.

SUMMARY OF THE INVENTION

The invention may be incorporated into an insulated-gate field effect transistor formed in a semiconductor region with an isolation dielectric on the sides of the source and drain regions. A highly-doped region of a conductivity-type opposite that of the source and drain is formed adjacent the isolation dielectric and adjacent the gate electrode on the source side of the gate electrode. This region may be formed by known techniques, such as implant and diffusion, in a self-aligned fashion relative to the isolation dielectric and the gate electrode. The presence of this region keeps the parasitic sidewall transistor threshold voltage at a relatively high value, after exposure to ionizing radiation, without causing shorting of source to drain in the event the diffusions are silicided.

BRIEF DESCRIPTION OF THE DRAWINGS

FIGS. 1b and 1c are sectional views of the transistor of FIG. 1a.

FIGS. 2b and 2c are sectional views of the transistor of FIG. 2a.

FIGS. 3b and 3c are sectional views of the MOS transistor of FIG. 3a.

DETAILED DESCRIPTION OF THE PREFERRED EMBODIMENT

Figure 1A:
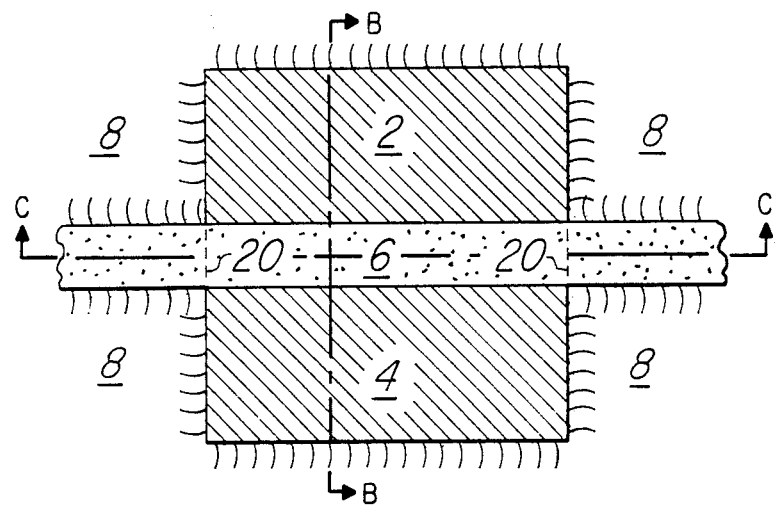
FIG. 1a is a plan view of an MOS transistor constructed according to the prior art.
Figure 1B:
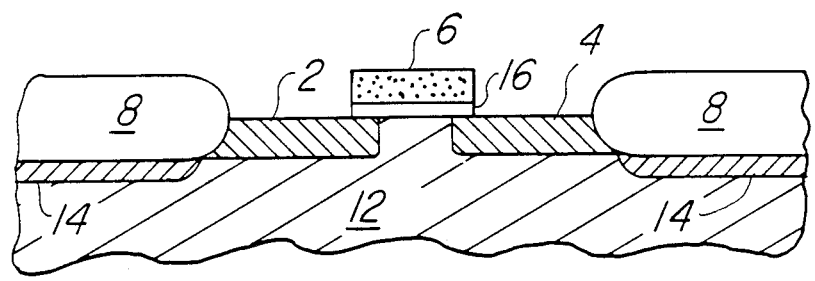
Figure 1C:
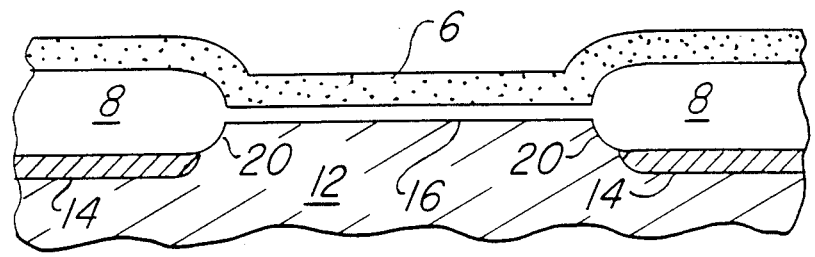

Referring to FIGS. 1a, 1b and 1c, an n-channel MOS transistor constructed according to the prior art is illustrated. FIG. 1a shows, in a plan view, n-type drain region 2 and n-type source region 4, with polysilicon gate electrode 6 overlying the channel region of the transistor lying between drain region 2 and source region 4. For the transistor of FIG. 1a, drain region 2 and source region 4 are implanted and diffused after the placement of gate electrode 6, in the well-known self-aligned fashion. The perimeter of drain region 2 and source region 4 away from gate electrode 6 is defined by field oxide 8, for purposes of isolation.

FIG. 1b is a cross-section of the structure looking in a direction parallel with gate electrode 6, showing the formation of the operating transistor in a p-type substrate 12. As is well known in the art, prior to the formation of field oxide 8, a channel stop implant is performed to provide for p-type regions 14 in the locations where field oxide 8 will be formed. P-type regions 14 are relatively more heavily-doped than substrate 12, to increase the threshold voltage of the parasitic transistors having field oxide 8 as the gate dielectric, thereby improving transistor-to-transistor isolation. After the channel stop implant, field oxide 8 is grown over the p-type regions 14 according to any one of a number of well-known local oxidation (LOCOS) methods, to a thickness on the order of 700 nm. In the area of substrate 2 not covered by field oxide 8 (often referred to as moat), gate dielectric 16 and polysilicon gate electrode 6 are formed and patterned in the desired location of the moat. Gate dielectric 16 is a known thin dielectric material such as silicon dioxide, or a combination of silicon dioxide and silicon nitride, having a thickness on the order of 10 to 20 nm. Source and drain regions 4 and 2, respectively, are formed in a self-aligned manner by implanting n-type dopants and subsequent diffusion to the desired depth. FIG. 1c is a cross-section of the transistor of FIG. 1a looking in a direction perpendicular to gate electrode 6, showing the overlap of gate electrode 6 from gate dielectric 16 onto field oxide 8.

A parasitic transistor is present in the structure of FIGS. 1a through 1c along the sidewalls of field oxide 8 at locations 20, i.e., where gate electrode 6 extends over the edge of field oxide 8. Normally this parasitic transistor will be in the non-conductive state since the thickness of field oxide 8, even at its edge, is significantly greater than that of gate dielectric 16. Accordingly, the parasitic transistor will be off when the operating transistor is off, and when the operating transistor is turned on, effectively all of the source-to-drain conduction will flow in the channel under thin gate dielectric 16. However, exposure to ionizing radiation will cause positive charge to be trapped within gate dielectric 16 and field oxide 8, as well as generate surface states at the interface between the dielectric layers and the underlying silicon of substrate 12. It is known that the flatband voltage of an MOS capacitor shifts, as a result of ionizing radiation exposure, to an extent which depends upon the second or third power of the thickness of the dielectric. For the n-channel transistor shown in FIGS. 1a through 1c, this shift is to cause the threshold voltage of an n-channel transistor to decrease in magnitude. Since the thickness of field oxide 8 is significantly thicker than the thickness of gate dielectric 16 (e.g., 700 nm versus 20 nm), the threshold voltage of the parasitic transistor at locations 20 will shift downwardly significantly more than will the threshold voltage of the operating transistor (i.e., the transistor with gate dielectric 16). If the dose of the radiation is sufficiently great, the parasitic transistor will conduct at locations 20 (i.e., under the edge of field oxide 8) at such times as the operating transistor normally conducts, affecting the effective width-to-length ratio of the transistor and the transistor's performance. Sufficient radiation may cause the parasitic transistor to become an enhancement mode device (i.e., conduct with zero potential difference between gate electrode 6 and source region 4), reducing the utility of the transistor in a digital (on-off) fashion. It should be noted that p-type regions 14 under field oxide 8, being more heavily doped than the portion of the substrate 12 at the edge of field oxide 8, will tend to keep the threshold voltage of the parasitic field oxide transistors away from the edge at a higher value, although the threshold voltage for creating a channel over the entirety of field oxide 8 will also be reduced by an ionizing radiation event as well.

Figure 2A:
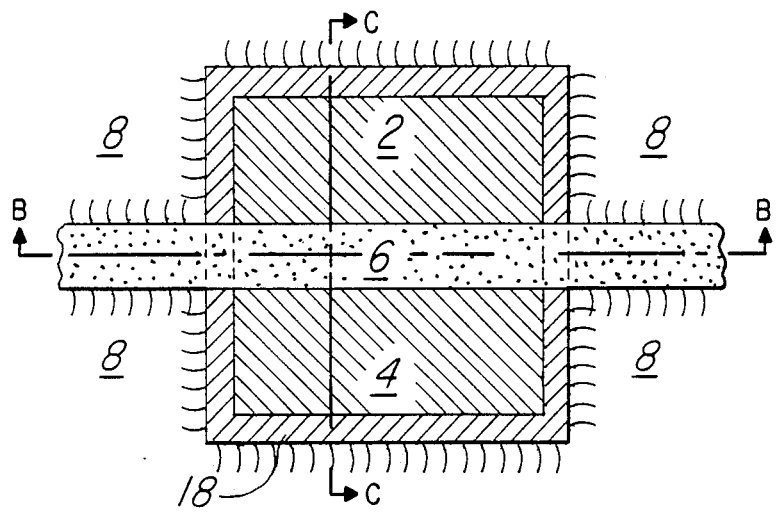
FIG. 2a is a plan view of a second MOS transistor constructed according to the prior art.
Figure 2B:
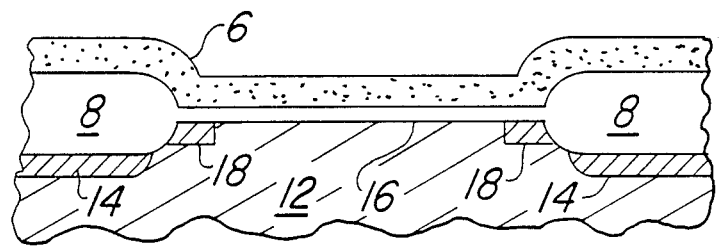
Figure 2C:
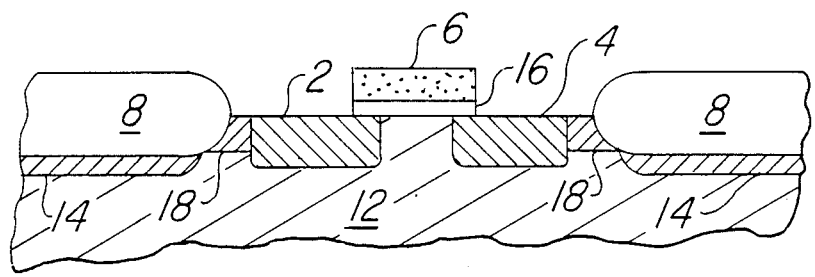

Referring now to FIGS. 2a through 2c, an n-channel MOS transistor structure constructed according to the prior art is shown as having a p-type diffused guard ring 18 surrounding the moat region of the device, i.e., surrounding the perimeter of source and drain regions 4 and 2, respectively, and underlying gate electrode 6 at the edge of field oxide 8. FIG. 2b illustrates the presence of guard ring 18 at the edges of field oxide 8, and extending thereunder. As in the case of the channel stop implant forming regions 14, the highly-doped p-type guard ring 18 serves to raise the threshold voltage of the parasitic sidewall transistor at the location under gate electrode 6 along the edges of field oxide 8, thereby reducing the sensitivity of the transistor to ionizing radiation exposure by raising the original threshold voltage of the parasitic transistor.

According to this prior construction, however, the formation of guard ring 8 was done by way of a masked p-type implant into the moat prior to the formation of gate electrode 6, in order to provide for guard ring 18 lying under gate electrode 6. While complementary MOS (CMOS) device indeed are fabricated with both n-type and p-type implants for formation of the source and drain of the n-channel and p-channel MOS transistors, respectively, such source and drain implants are performed after the formation of gate electrode 6 so that the source and drain diffusions are self-aligned relative to gate electrode 6, as shown in FIGS. 1b and 2c. The formation of guard ring 18 according to FIG. 2a thus requires a separate masking step (to define the location of guard ring 18) and a separate ion implant step, adding to the process complexity of the CMOS integrated circuit.

FIG. 2c is a sectional diagram of FIG. 2a looking in a direction parallel to gate electrode 6. According to this construction, drain region 2 and source region 4 both contact guard ring 18. Since guard ring 18 extends under gate electrode 6, a structure is formed which has n+drain region 2 contacting p+ guard ring 18 which in turn is contacting n+source region 4. In normal operation, drain region 2 will be biased to a positive voltage $V_{dd}$, while source region 4 will be at ground potential and substrate 12 (and thus guard ring 18) will be at ground potential or lower. A reverse biased p-n junction diode will thus be formed between drain region 2 and guard ring 18. However, as is well known in the art, the reverse bias breakdown voltage of a p-n junction depends upon the impurity concentration of the more lightly doped side at the p-n junction. Drain region 2 and source region 4 are highly-doped in order to provide for low resistivity conduction from source-to-drain through an "on" and in moat interconnect. While a heavy p-type doping is preferable for guard ring 18 in order to raise the initial threshold voltage as high as possible, the doping of guard ring 18 must be limited in the configuration of FIGS. 2a through 2c so that the junction between drain region 2 and guard ring 18 does not break down for the foreseeable range of the voltage difference between $V_{dd}$ (drain bias) and the bias of substrate 12.

In modern integrated circuits, the use of silicide cladding of the diffused moat regions and of the polysilicon gate electrodes and interconnects has become popular. Such silicide cladding, formed by way of the direct reaction of a refractory metal with exposed silicon as described in U.S. Pat. No. 4,690,730 issued Sept. 1, 1987, assigned to Texas Instruments Incorporated, results in reduced sheet resistance of the diffusion and polysilicon areas. It should be noted that the use of silicide-cladding with the structure of FIG. 2a is not feasible, as the cladding of drain region 2 according to the direct react method would result in a short circuit between the drain region 2 and guard ring 18 (shorting drain region 2 to substrate 12, as well as to source region 4).

Figure 3A:
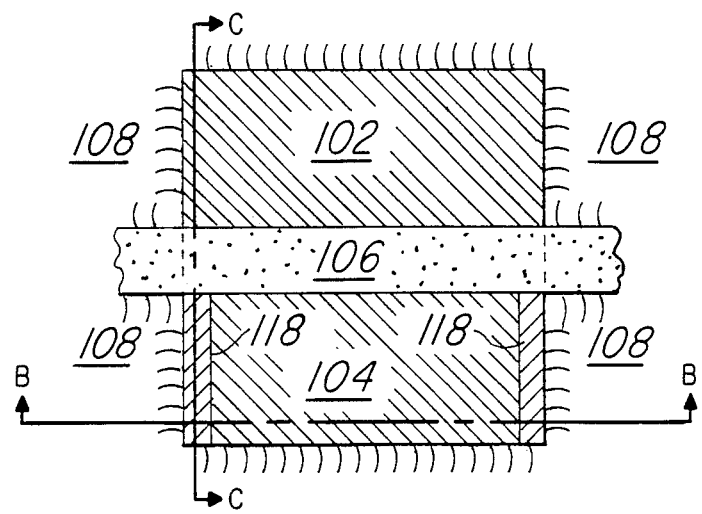
FIG. 3a is a plan view of an MOS transistor constructed according to the invention.

Referring now to FIG. 3a, a transistor constructed according to the invention is illustrated in plan view. This transistor includes n-type drain region 102 and n-type source regions 104, gate electrode 106 and field oxide 108 in a similar manner as the transistor of FIGS. 1a through 1c. The transistor of FIG. 3a further includes p+ diffused regions 118 along the edge of the source region 104 at field oxide 108, and extending up to gate electrode 106. P+regions 118 may be formed after the formation of gate electrode 106, as will be discussed in further detail below, so that p+regions 118 are self-aligned relative to gate electrode 106 along the edge of gate electrode 106, and do not extend under gate electrode 106 so as to contact drain region 102.

As shown in FIG. 3a, it should be noted that there is no p+ region 118 at the perimeter of source region 104 not at gate electrode 106 (i.e., at the bottom edge of source region 104 in FIG. 3a). The presence of p+ region 118 at this location would improve the ionizing radiation tolerance of the transistor according to this embodiment for ionizing radiation doses which are high enough to make both the region under field oxide 108 and the channel portion of substrate 112 at the edge of field oxide 108 enhancement mode. The placement of +region 118 at this location would prevent conduction from drain region 102 along the channel portion at the edge of field oxide 108, under field oxide 108 around p+ region 118 and into the bottom (as shown in FIG. 3a) of source region 104.

Figure 3B:
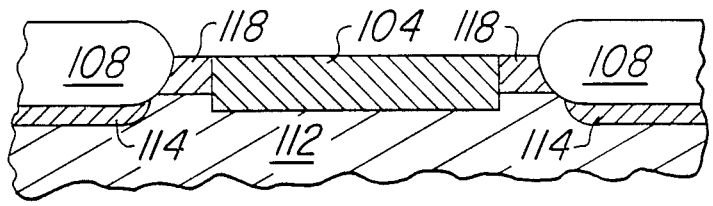
Figure 3C:
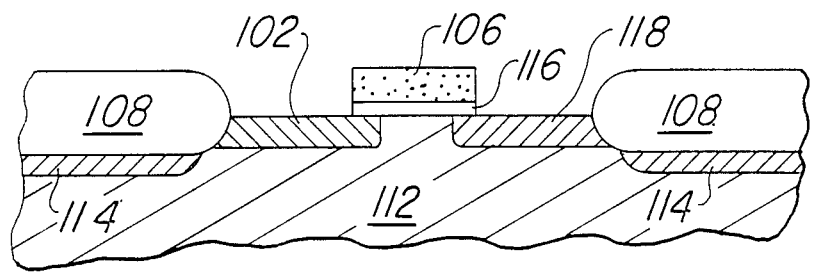

Referring now to FIG. 3b, a sectional view of the transistor of FIG. 3a is illustrated taken across source region 104 and looking in a direction perpendicular to gate electrode 106. FIG. 3b illustrates the location of p+ regions 118 at both edges of source region 104 at field oxide 108. FIG. 3c is a sectional view of the transistor of FIG. 3a looking in a direction parallel to gate electrode 106, at a location near one of the edges of field oxide 108. As shown in FIG. 3c, drain region 102 is self-aligned with gate electrode 106, extending thereunder to the extent of the lateral diffusion of the n-type dopant used to form drain region 102. Similarly, p+ region 118 is self-aligned relative to gate electrode 106, extending thereunder to the extent of the lateral diffusion of the p-type dopant used to form p+ region 118. P+ region 118 does not directly contact drain region 102, as the portion of substrate 112 forming the channel of the operating transistor remains between p+ region 118 and drain region 102 under gate electrode 106. This channel region will be generally be lightly doped relative to p+ region 118, even if implanted for purposes of adjusting the threshold voltage of the operating transistor in a manner well known in the art.

Figure 4A:
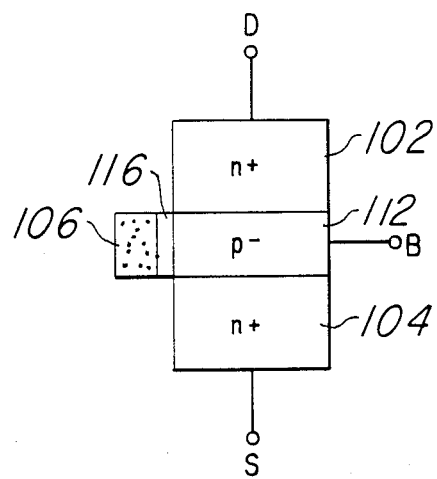
FIGS. 4a, 4b, 4c and 4d are schematic diagrams of the source-to-drain conduction paths of the transistor of FIGS. 3a through 3c.

FIGS. 4a through 4d schematically illustrate the potential conduction paths from source to drain in the transistor of FIGS. 3a through 3b. Referring to FIG. 4a, the operating transistor is schematically illustrated by n+ drain region 102 separated from n+ source region 104 by the channel portion of p− substrate 112. The channel portion of substrate 112 is generally biased to the potential of source region 104, or to a potential lower than source region 104, depending upon the desired transistor characteristics. Such bias, while not essential for operation of the transistor, stabilizes the threshold voltage and also ensures that the p-n junction between substrate 112 and source region 102 is not forward biased. Gate dielectric 116 separates the channel portion of p− substrate 112 from gate electrode 106 and, as is well known for MOS transistors, will control the operation of the transistor. FIG. 4a corresponds to source-to-drain conduction occurring under gate electrode 106 at a location away from p+region 118. As described above, exposure of the transistor to ionizing radiation will affect this conduction path to a lesser degree than paths under field oxide 108, due to gate dielectric 116 being substantially thinner than field oxide 108.

Figure 4B:
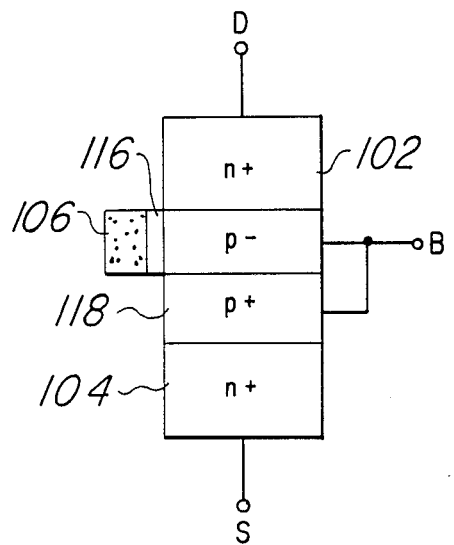

Referring to FIG. 4b, another potential source-drain conduction path is schematically illustrated. This path is from drain region 102 through the channel portion of p-substrate 112 under gate dielectric 116, through p+ region 118 and into source region 104. Since substrate 112 and p+ region 118 are both p-type, the substrate bias will also bias p+ region 118 if source region 104 is not silicide-clad so as to short p+ region 118 to source region 104. If source region 104 is silicided, as described below, source region 104 and p+ region 118 will be at the same potential. Again, as in the case of the conduction path of FIG. 4a, the effects of ionizing radiation on this path will be reduced relative to the effects on conduction paths under the field oxide 108, due to the relative thickness of gate dielectric 116 to field oxide 108. In normal operation, the conduction through this path will be minimal compared to the conduction through the path illustrated in FIG. 4a, since any channel formed in substrate 112 due to the bias of gate electrode 106 will meet a reverse biased p-n junction at p+region 118.

Figure 4C:
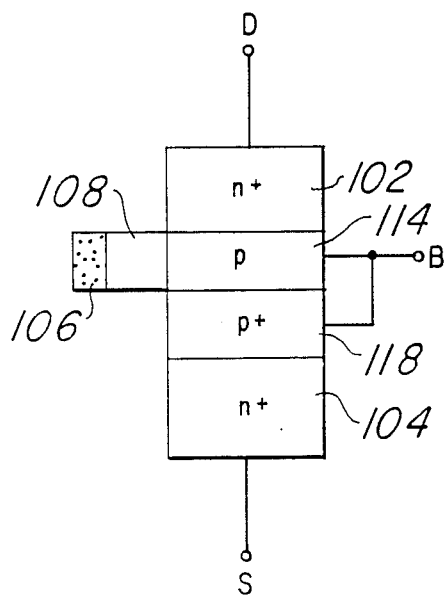

Referring to FIG. 4c, a potential conduction path is schematically illustrated which goes under field oxide 108. This path is from drain region 102 through channel stop p-type region 114 under field oxide 108, through p+region 118 and into source region 104. As a result of ionizing radiation exposure, the threshold voltage of the field oxide transistor (gate electrode 106 over field oxide 108) may be sufficiently reduced so as to be an enhancement mode device, i.e., the portion of channel stop region 114 under field oxide 108 will be inverted with the gate electrode at the same voltage as source region 104. However, due to the incorporation of p+ region 118 according to the invention, a reverse-biased diode is present at the junction of p+ region 118 and any n-channel formed in channel stop region 114, since the potential of p+region 118 is at or below the voltage of source region 104, and therefore below the voltage of drain region 102 and such a channel. This prevents source-drain conduction even in the case of an enhancement mode channel under field oxide 108 due to the decrease in threshold voltage from the ionizing radiation exposure.

Figure 4D:
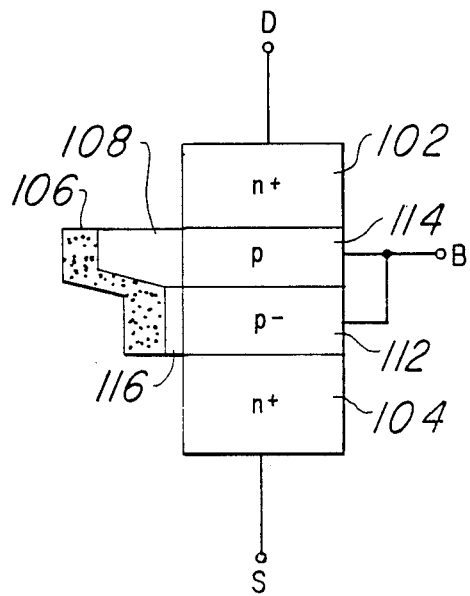

Referring to FIG. 4d, the fourth potential conduction path is schematically illustrated. This path is from drain region 102 through channel stop region 114 under field oxide 108, and through the channel portion of − substrate 112 under gate dielectric 116 to source region 104. Again, even if the ionizing radiation is sufficient to form a channel in channel stop region 114 under field oxide 108, the effects of such radiation on the thin gate dielectric 116 will be reduced, in a similar manner as the conduction paths illustrated in FIGS. 4a and 4b. Accordingly, the potential conduction path of FIG. 4d in the transistor constructed according to the invention will not conduct in the event that the ionizing radiation exposure is sufficient to reduce the threshold voltage of the parasitic field oxide transistor to enhancement mode, but not to so reduce the threshold voltage of the operating transistor to enhancement mode. The path of FIG. 4d will thus only conduct in the event that the paths of FIGS. 4a and 4b conduct, which is at a higher exposure than that required to cause the parasitic field oxide transistor to conduct.

Referring back to FIG. 3a through 3c, it should be noted that, since p+ region 118 is not to be formed under the channel or in contact with drain region 102, p+ region 118 can be formed after the formation of gate electrode 106. Indeed, it is preferable that p+ region 118 be formed after the formation of gate electrode 106 in self-aligned fashion relative to gate electrode 106 as shown in FIG. 3c. Since 30 region 118 can be formed after gate electrode 106, the transistor according to the invention is especially applicable to a CMOS process having both n+ and p+ source and drain regions, since p+ region 118 can be formed with the same implant and diffusion as such p+ source and drain diffusions. Since a masking step is required for each of the n+ and p+ source/drain implants, so that no n+ implant occurs in the site of p+ source/drains and vice versa, the location of p+ region 118 and n+ source region 104 as shown in FIG. 3a may be individually defined by conventional photolithography without adding a mask step or an implant to the CMOS process flow. The n+ and p+ implants may be performed in either the n-type implant prior to the p-type implant implant, or vice versa).

It should further be noted that there is no direct contact between p+ region 118 (or any p+ region) and n+ drain region 102 in the transistor of FIGS. 3a through 3c according to the invention. Accordingly, p+ region 118 can be doped as heavily as practicable in order to achieve the desired radiation tolerance without adversely affecting the junction breakdown at the boundary of drain region 102, unlike the transistor formed according to the prior art as shown in FIGS. 2a through 2c. An example of the construction of such a transistor according to the invention, with a channel length of 1 micron, can have the impurity concentration in the range of $10^{18}$ to $10^{21}$/cm$^3$, with the channel portion of substrate 112 having an impurity concentration of $10^{17}$/cm$^3$, source and drain regions 104 and 102 having an impurity concentration of $10^{19}$ to $10^{21}$/cm$^3$, and channel stop region 114 having an impurity concentration of $10^{16}$ to $10^{18}$/cm$^3$. The contact between p+ region 118 and n+ source region 104 presents less of a problem for junction breakdown since substrate 112 is generally biased at the same potential as source region 104, or at a lower voltage which is relatively close to source region 104 (for example, 2 to 3 volts).

Figure 5:
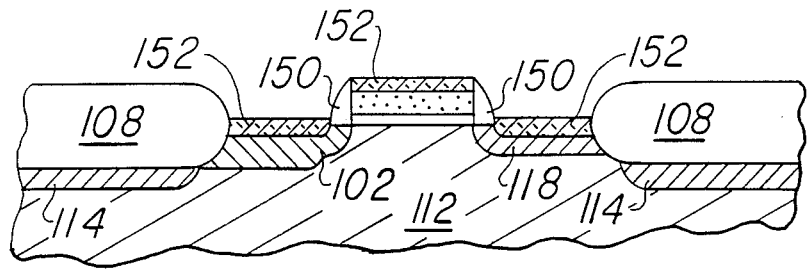
FIG. 5 is a sectional view of another embodiment of the MOS transistor of the invention with silicide-clad diffusions and gate electrode.

Referring now to FIG. 5, another embodiment of a transistor formed according to the invention is illustrated in a cross-sectional view taken at the same location as FIG. 3c described above. The transistor of FIG. 5 further includes the formation of sidewall oxide filaments 150 at the sides of gate electrode 106, for the formation of a graded drain junction in a manner known in the art and used in modern integrated circuits.

The sidewall filaments 150 assist in the formation of a silicide film 152 on the diffused regions (102, 104, 118) as well as on gate electrode 106, by reducing the propensity for moat-to-poly shorting by the silicide film. As shown in FIG. 5, the transistor according to the invention may have silicide film provided on drain region 102, source region 104 and p+ region 118 without shorting drain region 102 to source region 104, since p+ region 118 is in contact only with source region 104 and is not in contact with drain region 102.

Figure 6A:
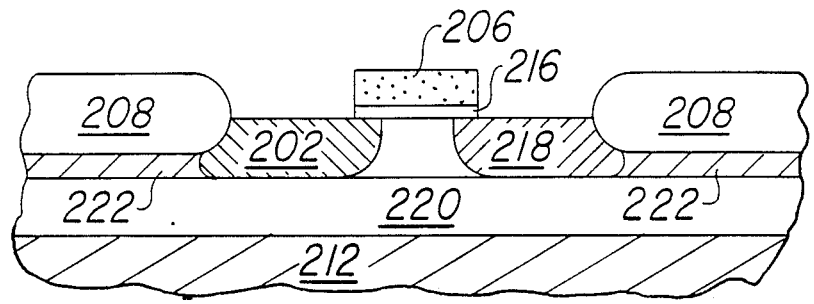
FIGS. 6a through 6c are sectional views of additional embodiments of the MOS transistor of the invention in silicon-on-insulator form.
Figure 6B:
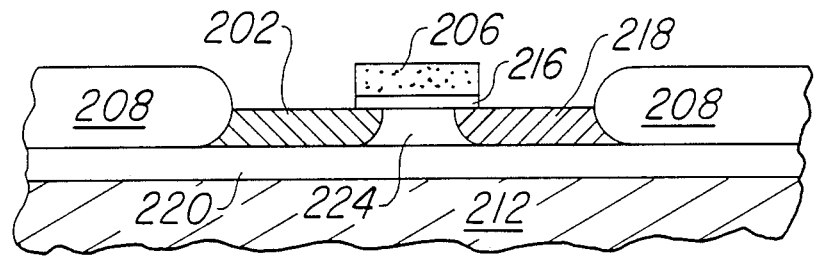
Figure 6C:
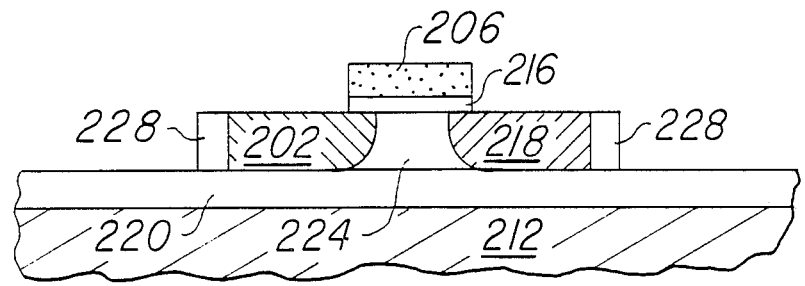

Referring now to FIGS. 6a through 6c, additional embodiments of a transistor according to the invention is illustrated. This transistor can appear from a plan view similar as the transistor of FIG. 3a, but is formed in a silicon-on-insulator (SOI) or silicon-on-sapphire (SOS) configuration where the active regions of the device are in recrystallized polysilicon, or in crystalline silicon formed in other ways according to the art. For example, the active regions in FIG. 6a are shown as formed on an insulator layer 220 over substrate 212. The cross-sectional view shown in FIG. 6a shows n+ drain region 202 on one side of gate electrode 206 over gate dielectric 216, with p+ region 218 on the other side of gate electrode 206 in a similar manner as in FIGS. 3a through 3c. Field oxide 208, shown in FIG. 6a as being formed by the partial local oxidation of body silicon 222, isolates the SOI transistors from one another, and is disposed over body silicon 222 which, if desired, may have a channel stop implant thereunder. P— channel region 224 is located under gate electrode 206 and serves as the operating transistor channel as in the transistor of FIGS. 3a through 3c. The operation and benefits of the transistor formed according to FIG. 6 are similar to that of the transistors of FIGS. 3a through 3c. In the SOI configuration, however, the transistor built according to the invention has the additional advantage of providing electrical contact to channel region 224. Since p+ region 218 extends away from channel region 224 but makes electrical contact thereto, contact may be made to p+ region 218 to provide a bias to channel region 224 in a manner similar to the substrate bias for the transistor of FIGS. 3a through 3b, providing for more stable operation of the SOI transistor.

FIGS. 6b and 6c illustrate additional configurations of the SOI or SOS structure of FIG. 6a. FIG. 6b illustrates the embodiment where isolation is formed by the complete oxidation of the body silicon 222 of FIG. 6a, so that field oxide 208 extends to the top of insulator 220. In this case, there is no body region 222 under the field oxide region 208. The embodiment of FIG. 6c illustrates mesa isolation in which the body silicon 222 of FIG. 4a is etched away completely, down to insulator 220. The sides of drain region 202 and p+ region 218 are passivated by sidewall filaments 228. In the cases shown in FIGS. 6b and 6c, the parasitic field oxide transistor of FIG. 6a (and illustrated in the conduction paths of FIGS. 4c and 4d) are replaced with the parasitic sidewall transistors where the gate electrode 206 crosses the edge of field oxide 208 (in FIG. 6b) or sidewall filament 228 (in FIG. 6c). P+ region 218 operates in the same manner as described above for FIG. 4c to prevent source-to-drain conduction in such cases.

Although the invention has been described in detail herein with reference to its preferred embodiments, it is to be understood that this description is by way of example only, and is not to be construed in a limiting sense. It is to be further understood that numerous changes int he details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

We claim:

1. An insulated-gate field effect transistor at a surface of a semiconductor body, comprising:

an insulating layer disposed at selected locations of said surface to define an active region of said semiconductor body;

a gate electrode disposed over a portion of said active region and extending onto said insulating layer;

a drain region of a first conductivity type disposed at said surface within said active region on a first side of said gate electrode, said drain region extending to the edge of said insulating layer at a location adjacent to said gate electrode;

a source region of said first conductivity type disposed at said surface within said active region on a second side of said gate elctrode;

a guard region of a second conductivity type disposed in said active region between said source region and said insulating layer at a location adjacent said gate electrode;

a channel region of said second conductivity type having a portion disposed under said gate electrode between said guard region and said drain region, and having a portion disposed under said gate electrode between said source region and said drain region, said channel region being less heavily doped than said guard region; and a channel stop region of said second conductivity type formed under said insulating layer.

2. The transistor of claim 1, wherein said first conductivity type is n-type and said second conductivity type is p-type.

3. An insulated-gate field effect transistor at a surface of a semiconductor body, comprising:

an insulating layer disposed at selected locations of said surface to define an active region of said semiconductor body;

a gate electrode disposed over a portion of said active region and extending onto said insulating layer;

a drain region of a first conductivity type disposed at said surface within said active region on a first side of said gate electrode, said drain region extending to the edge of said insulating layer at a location adjacent to said gate electrode;

a source region of said first conductivity type disposed at said surface within said active region on a second side of said gate electrode;

a guard region of a second conductivity type disposed in said active region between said source region and said insulating layer at a location adjacent said gate electrode; and a channel region of said second conductivity type having a portion disposed under said gate electrode between said guard region and said drain region, had having a portion disposed under said gate electrode between said source region and said drain region, said channel region being less heavily doped than said guard region;

wherein the junction between said guard region and said source region is reverse-biased.

4. The transistor of claim 3, wherein said guard region is biased to the same voltage as said source region.

5. The transistor of claim 3, wherein said guard region is biased to a voltage below the voltage of said source region.

6. The transistor of claim 1, further comprising:

a second insulating layer;

and wherein said semiconductor body is a layer of silicon disposed over said second insulating layer.

7. The transistor of claim 3, wherein said first conductivity type is n-type and said second conductivity type is p-type.

8. The transistor of claim 3, further comprising:

a second insulating layer;

and wherein said semiconductor body is a layer of silicon disposed over said second insulating layer.

9. An insulated-gate field effect transistor at a surface of a semiconductor body, comprising:

an insulating layer disposed at selected locations of said surface to define an active region of said semiconductor body;

a gate electrode disposed over a portion of said active region and extending onto said insulating layer;

a drain region of a first conductivity type disposed at said surface within said active region on a first side of said gate electrode, said drain region extending to the edge of said insulating layer at a location adjacent to said gate electrode;

a source region of said first conductivity type disposed at said surface within said active region on a second side of said gate electrode;

a guard region of a second conductivity type disposed in said active region between said source region and said insulating layer at a location adjacent said gate electrode;

a channel region of said second conductivity type having a portion disposed under said gate electrode between said guard region and said drain region, and having a portion disposed under said gate electrode between said source region and said drain region, said channel region being less heavily doped than said guard region, and a silicide film disposed over said drain region, said source region, and said guard region.

10. The transistor of claim 9, wherein said first conductivity type is n-type and said second conductivity type is p-type.

11. The transistor of claim 9, further comprising:

a second insulating layer;

and wherein said semiconductor body is a layer of silicon disposed over said second insulating layer.

* * * * *